(12) United States Patent
Lechner et al.

(10) Patent No.: US 10,729,022 B2
(45) Date of Patent: Jul. 28, 2020

(54) CASING FOR A CONTROL UNIT AND COVERING HOOD FOR THE CASING

(71) Applicant: KNORR-BREMSE SYSTEME FUER NUTZFAHRZEUGE GMBH, Munich (DE)

(72) Inventors: Klaus Lechner, Pretzfeld (DE); Elena Mueller, Nuremberg (DE); Norbert Behrendt, Stein (DE)

(73) Assignee: KNOR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 0 days.

(21) Appl. No.: 16/331,363

(22) PCT Filed: Sep. 12, 2017

(86) PCT No.: PCT/EP2017/072920
§ 371 (c)(1),
(2) Date: Mar. 7, 2019

(87) PCT Pub. No.: WO2018/050651
PCT Pub. Date: Mar. 22, 2018

(65) Prior Publication Data
US 2019/0364677 A1 Nov. 28, 2019

(30) Foreign Application Priority Data

Sep. 15, 2016 (DE) .......................... 10 2016 117 330

(51) Int. Cl.
*H05K 5/00* (2006.01)
*H05K 5/02* (2006.01)

(52) U.S. Cl.
CPC ........... *H05K 5/0026* (2013.01); *H05K 5/023* (2013.01)

(58) Field of Classification Search
CPC ................. H05K 5/0026; H05K 5/023; H01R 13/62977; H01R 13/62972; H01R 13/5829; Y10S 439/901
See application file for complete search history.

(56) References Cited

U.S. PATENT DOCUMENTS 5,921,807 A * 7/1999 Okabe .................. H01R 13/514
439/467
6,000,967 A * 12/1999 Norizuki ............ H01R 13/4362
439/596
(Continued)

FOREIGN PATENT DOCUMENTS

DE 102012102188 A1 9/2013
DE 102013104305 A1 5/2014
(Continued)

OTHER PUBLICATIONS

International Search Report dated Dec. 15, 2017, of the corresponding International Application PCT/EP2017/072920 filed Sep. 12, 2017.

*Primary Examiner* — Daniel P Wicklund
*Assistant Examiner* — Sagar Shrestha
(74) *Attorney, Agent, or Firm* — Norton Rose Fulbright US LLP; Gerard Messina

(57) ABSTRACT

A casing for a control unit, including: a connector region, situated on a connector side of the casing, is close-able by two covering hoods, each of the covering hoods including at least one hinge element; and at least two gripping arms, which are configured to at least partially engage around the at least one hinge element of the two covering hoods and to hold it rotationally; in which the two covering hoods are place-able at different positions on the connector region of the casing and are close-able rotationally. Also described are a related covering hood, a control unit, and a commercial vehicle.

13 Claims, 5 Drawing Sheets

(56) References Cited

U.S. PATENT DOCUMENTS

| | | | | |
|---|---|---|---|---|
| 6,083,056 A * | 7/2000 | Okabe | .................. | H01R 13/506 |
| | | | | 439/598 |
| 6,250,972 B1 * | 6/2001 | Shinchi | ................ | H01R 13/504 |
| | | | | 439/465 |
| 6,464,532 B1 * | 10/2002 | L'Abbate | ............. | H01R 12/772 |
| | | | | 439/467 |
| 10,090,613 B2 * | 10/2018 | Choi | .................... | H01R 13/501 |
| 2003/0022549 A1 * | 1/2003 | Castaldo | ................ | H01R 24/28 |
| | | | | 439/467 |
| 2003/0139094 A1 * | 7/2003 | Venditti | ............... | H01R 13/506 |
| | | | | 439/596 |
| 2008/0164793 A1 * | 7/2008 | Ozawa | .................. | H01R 12/71 |
| | | | | 312/270.2 |
| 2010/0300909 A1 | 12/2010 | Hung | | |
| 2013/0113166 A1 | 5/2013 | Hjerpe | | |
| 2014/0202899 A1 | 7/2014 | Murchison et al. | | |
| 2015/0300063 A1 * | 10/2015 | Soma | ...................... | E05D 3/022 |
| | | | | 16/232 |
| 2016/0181751 A1 * | 6/2016 | Affeltranger | ........ | H01R 13/514 |
| | | | | 439/638 |
| 2016/0204543 A1 * | 7/2016 | Kanda | ................ | H01R 13/5812 |
| | | | | 439/470 |
| 2016/0315459 A1 * | 10/2016 | Nakashima | .......... | H05K 5/0247 |
| 2016/0344138 A1 * | 11/2016 | Kazmier | ............. | G01R 21/133 |

FOREIGN PATENT DOCUMENTS

| | | |
|---|---|---|
| RU | 133183 U1 | 10/2013 |
| WO | 2004012216 A1 | 2/2004 |

* cited by examiner

CASING FOR A CONTROL UNIT AND COVERING HOOD FOR THE CASING

FIELD OF THE INVENTION

The present invention relates to a casing for a control unit and to a covering hood for the casing and, in particular, to a fastening arrangement of a covering hood without additional parts.

BACKGROUND INFORMATION

It is important in the case of control units and, in particular, in the case of control units such as are used in vehicles (for example, commercial vehicles) that the electronics of the control units are protected reliably against moisture and contamination. To this end, the (electric) connector lines are protected against the environmental influences by way of additional covering hoods and are at the same time held reliably. It frequently occurs, however, that not only one connector line is fastened to a control unit, but rather that a plurality of connector lines are to be fastened in a connector region of the control unit. Accordingly, a plurality of covering hoods are frequently used, in order to protect the various connector lines and at the same time to fix them on the control unit.

In the case of conventional control units, either different covering hoods are used, in order to protect various sections of a connector region, or else additional fastening parts are required, in order to use identical covering hoods for the various sections.

SUMMARY OF THE INVENTION

In order to design the production of the control units and/or the covering hoods to be more efficient and at the same time to facilitate the connection of the lines, there is a requirement to use identical covering hoods for various sections of a connector region of a casing, without additional parts being required, in order to attach the identical covering hoods to various points of the control unit.

At least some of the abovementioned problems may be solved by way of a casing as described herein and a covering hood as described herein. Advantageous developments of the subjects of the main descriptions herein are defined by the further descriptions herein.

The present invention relates to a casing for a control unit. The casing comprises a connector region and at least two gripping arms. The connector region is situated on a connector side of the casing and can be closed by way of two covering hoods, each covering hood comprising at least one hinge element. The at least two gripping arms are configured to at least partially engage around the at least one hinge element of the two covering hoods and to hold it rotationally, it being possible for the at least two covering hoods to be placed (in each case) on the connector region of the casing at different positions and to be closed rotationally.

The casing can optionally have two closure elements, and each covering hood can have a locking element, with the result that the locking elements of the two covering hoods can engage with the two closure elements and can block opening of the covering hoods as a result.

Within the context of the present invention, the term "engage around" is not to be understood in such a way that the gripping arms engage completely around the corresponding hinge elements. Rather, the gripping arms are to engage around the hinge elements merely to such an extent that the covering hoods are held on one side by way of the gripping arms after the placing and rotating of the covering hoods. A complete grip can be achieved, for example, only after locking by way of the closure element/elements. The closure elements for the covering hoods can be sections of the casing which are arranged at different positions, in order to fix the two covering hoods.

The two covering hoods which can be placed on the casing can be structurally identical, for example. They can also optionally differ, however, it being possible in accordance with exemplary embodiments of the present invention for the two covering hoods which are possibly of different design to be placed on the connector region of the casing at the two positions. In this way, the two covering hoods can be swapped among one another and do not need to be placed at a predefined position.

Moreover, all the arrangements which are required for fixing the covering hoods are provided either by way of the covering hood itself or by way of the casing or by way of the covering hood which is arranged so as to lie opposite. In this way, no additional parts or elements are required, in order to attach the two covering hoods to the casing.

The casing can optionally have a bottom structure and a top structure, electronic components being arranged in the bottom structure and there being by way of example electric (or else optical) connector sockets in the top structure. The two (structurally identical) covering hoods can open and close in each case one side of the top structure, in order to protect or to expose the connectors.

Each covering hood can optionally have in each case two hinge elements which are arranged along an edge asymmetrically from a center. Accordingly, in the case of further exemplary embodiments, the at least two gripping arms can comprise four gripping arms, of which two gripping arms hold one covering hood and the two other gripping arms hold the other covering hood, and the two covering hoods are arranged on the connector side of the casing rotated by 180° with respect to one another.

The asymmetrical arrangement of the hinge elements along the edge of the covering hood is, for example, such that the two hinge elements are not of mirror-symmetrical configuration along a center line of the covering hood, but rather that one hinge element is at a greater spacing from the center line than the other hinge element. This achieves a situation where two covering hoods can be placed onto the casing such that they lie opposite one another (that is to say, rotated by 180°), without the hinge elements impeding each other, but rather being placed on the casing offset with respect to one another. For example, after the placing of the covering hoods, the hinge elements are arranged adjacently with respect to one another.

Therefore, in exemplary embodiments, the at least two gripping arms and the closure element are configured so as to make swapping of the two covering hoods on the casing possible.

The hinge elements optionally comprise in each case one rod-shaped section which has a flattened section in a cross-sectional view perpendicularly with respect to a rotational axis of the respective hinge element. Accordingly, the casing can optionally comprise at least two bearings which are configured to support the rod-shaped section of the respective hinge element toward the connector side of the casing and to mount it such that it can be rotated about the rotational axis. The at least two gripping arms need to engage only partially around the rod-shaped hinge elements of the two covering hoods, in order to make an insertion or removal of the covering hood possible in at least one angular position (for example, perpendicularly) relative to the casing, and to hold the covering hood on the casing by way of a positively locking connection after a rotation of the covering hood (for example, by 90°).

Therefore, a rotation of the covering hoods relative to the casing establishes a positively locking connection between the covering hood and the casing, which positively locking connection is released for a defined angular position or a defined angular range (for example, in the case of a perpendicular position of the covering hood relative to the casing). Here, every positively locking connection is possible. For example, the rod-shaped sections of the hinge elements can be formed in a semicircular manner (that is to say, the flattened section extends along the diameter).

In the case of further exemplary embodiments, the at least two gripping arms (and the two bearings) are configured to hold the two covering hoods such that they can be rotated about a common rotational axis.

The present invention also relates to a covering hood for the above-described casing. The covering hood comprises at least one hinge element which is configured to be held rotationally by way of one of the gripping arms (for example, in a defined angular range).

Furthermore, the covering hood can comprise a locking element which is configured to prevent opening of the covering hood by way of coupling to the closure element of the casing. The coupling between the locking element and the closure element of the casing blocks, for example, a rotation of the covering hood by way of latching of the locking element in the closure element of the casing. This prevents it being possible for the covering hood to pass into the angular position, in which it can be removed from the casing, with the result that the covering hood is fixed on the casing and cannot be moved relative to the casing.

In the case of further exemplary embodiments, the hinge element comprises (as has already been stated) a rod-shaped section which has a flattened section in a cross-sectional view perpendicularly with respect to a rotational axis of the hinge element, in order to make an insertion or removal of the covering hood possible (for example, perpendicularly with respect to the connector side of the casing) in at least one angular position relative to the casing, and to hold the covering hood on the casing by way of a positively locking connection after a rotation of the covering hood. For example, the rod-shaped section of the hinge element can have a semicircular cross section perpendicularly with respect to the rotational axis, the flattened section being configured in such a way that the gripping arm can be guided past it and an insertion of the covering hood is made possible as a result.

In the case of further exemplary embodiments, the hinge element defines an opening, into which one of the at least two gripping arms of the casing can be introduced, in order to engage around the hinge element. In this way, for example, a firm seat of the covering hood on the casing is made possible, whereas (only) rotational movements remain possible. A displacement parallel to the casing surface is prevented, however.

The covering hood optionally comprises at least one projection which is configured to support a hinge element of the further covering hood which is arranged on the casing so as to lie opposite the covering hood.

In the case of further exemplary embodiments, the at least one projection comprises two projections which have in each case one semicircular bearing section perpendicularly with respect to the rotational axis, in order to receive in each case one hinge element of the further covering hood and to mount it rotationally.

The casing optionally comprises at least one casing cutout, and the covering hood likewise comprises at least one cutout which forms an opening with the casing cutout after closure of the covering hood on the casing. An electric connector line can be introduced into the closed casing through said opening.

The covering hood optionally comprises a lateral apron for the lateral protection of electric connectors which are situated below the covering hood.

In the case of further exemplary embodiments, the closure element of the casing comprises a latching element, and the locking element is a latching closure which can be latched on the latching element.

The present invention also relates to a control unit for a vehicle, in particular for a commercial vehicle, having an above-described casing and a first and a second above-described covering hood. Moreover, the invention also relates to a commercial vehicle having the control unit.

Exemplary embodiments of the present invention afford the advantage that inexpensive and simple fastening of covering hoods on a casing becomes possible. In particular, no additional parts are required for fixing the covering hood. Moreover, identical or structurally identical covering hoods can be used, in order to fasten them at opposite positions on the casing or on a side of the casing and to close them rotationally.

In the case of the specification of values or range limits, it is assumed within the context of the present invention that the relevant specifications are not variables which are to be complied with precisely, but rather that a defined tolerance range is also to be included. Said tolerance range can be defined, for example, by way of deviations of ±20% or ±10% from the relevant value.

The exemplary embodiments of the present invention will be comprehended in an improved manner by way of the following detailed description and the appended drawings of the different exemplary embodiments which should not be understood, however, to restrict the disclosure to the specific embodiments, but rather serve merely for explanation and comprehension.

DETAILED DESCRIPTION

Figure 1:
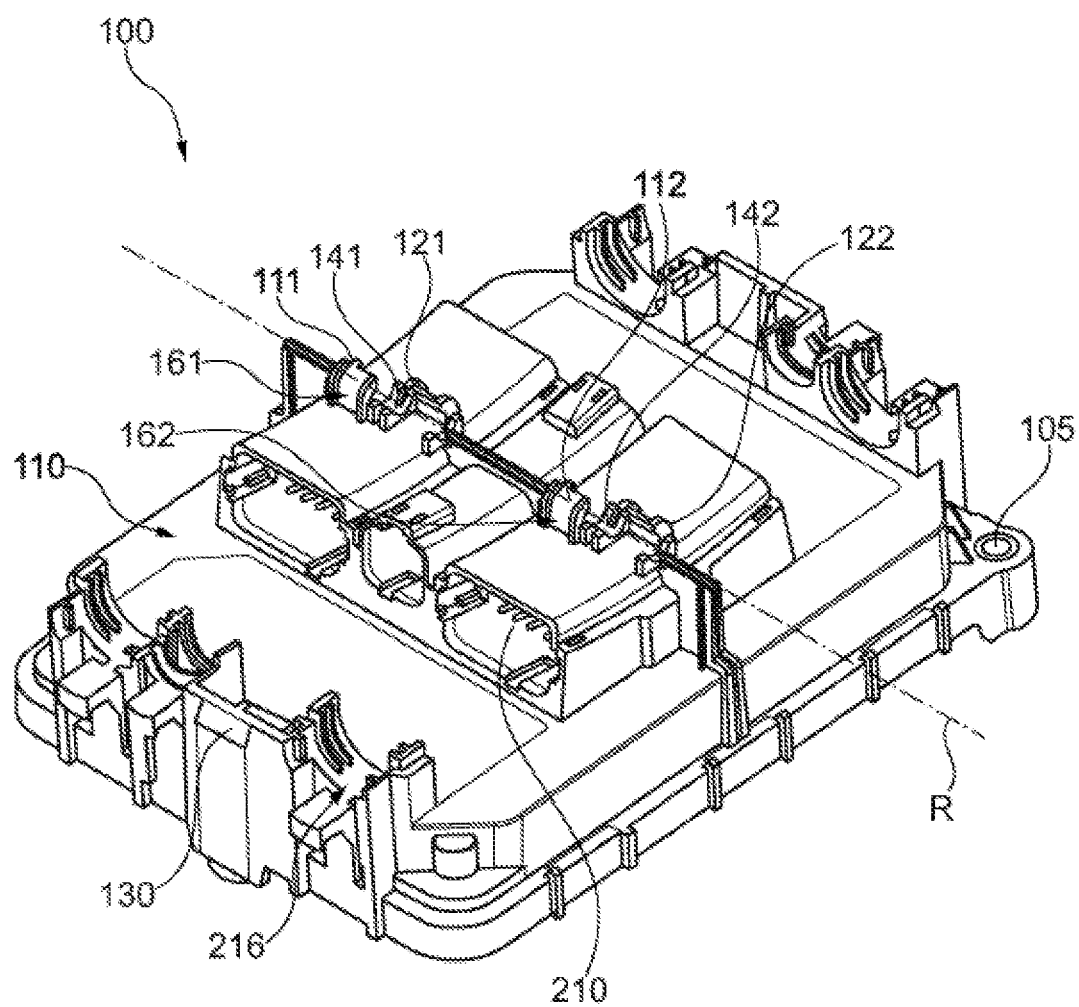
FIG. 1 shows a casing for a control unit in accordance with one exemplary embodiment of the present invention.

FIG. 1 shows a casing 100 which is suitable for a control unit (for example, in commercial vehicles). The casing 100 comprises a connector region 110 which is configured, for example, on a side (connector side, top in FIG. 1) of the casing 100. The connector region 110 can be closed by way of two covering hoods (not visible in FIG. 1). In order to close the connector region 110 by way of the covering hoods, the casing comprises, for example, four gripping arms 111, 112, 121, 122. The casing 100 optionally has fastening arrangement 105 which makes fastening of the casing 100 possible, for example to a vehicle (for example, by way of a screw connection).

Figure 2:
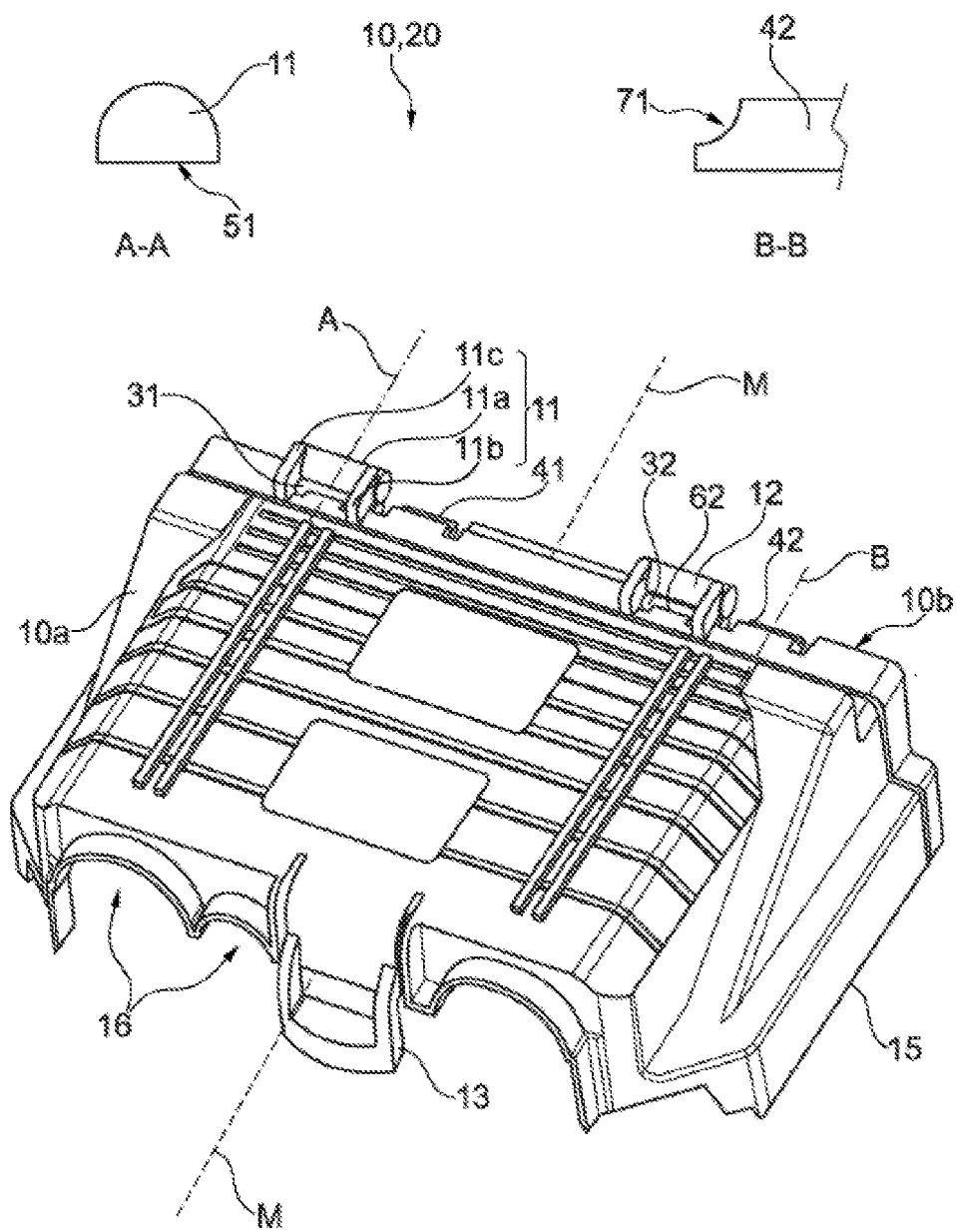
FIG. 2 shows a covering hood for the casing from FIG. 1 in accordance with one exemplary embodiment.

FIG. 2 shows one of the two covering hoods 10, 20 which can be placed on the casing 100 of FIG. 1. The covering hood 10, 20 which is shown comprises two hinge elements 11, 12 which are configured to be held rotationally at least in an angular range in each case by way of a gripping arm 111, 112 (or 121, 122) of the casing 100 from FIG. 1. The gripping arms 111, 112 are configured to grip at least partially around the at least one hinge element 11, 12 of the two covering hoods.

Figure 3:
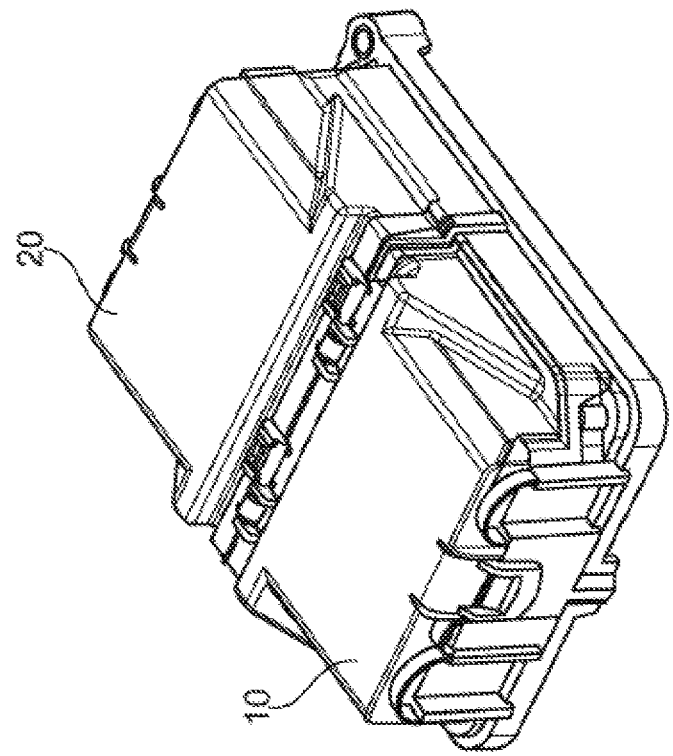
FIG. 3 shows a three-dimensional view of the casing with covering hoods which are placed on it.
Figure 3:
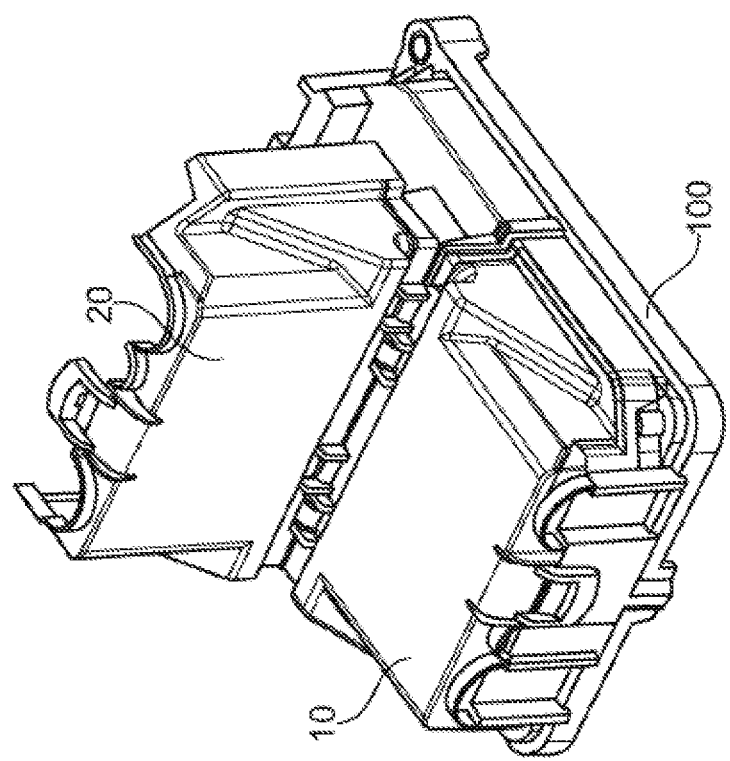

FIG. 3 shows a three-dimensional view of the casing 100, the two covering hoods 10, 20 being placed on it. First of all, that state can be seen on the left-hand side, in the case of which state one covering hood 10 is closed and a further covering hood 20 lies perpendicularly upward (open state). As will be described in detail in the following text, a positively locking connection between the further covering hood 20 and the covering hood 10 which has already been fastened and/or the casing 100 takes place after the rotation of the further covering hood 20. The result can be seen on the right hand side of FIG. 3.

Figure 4:
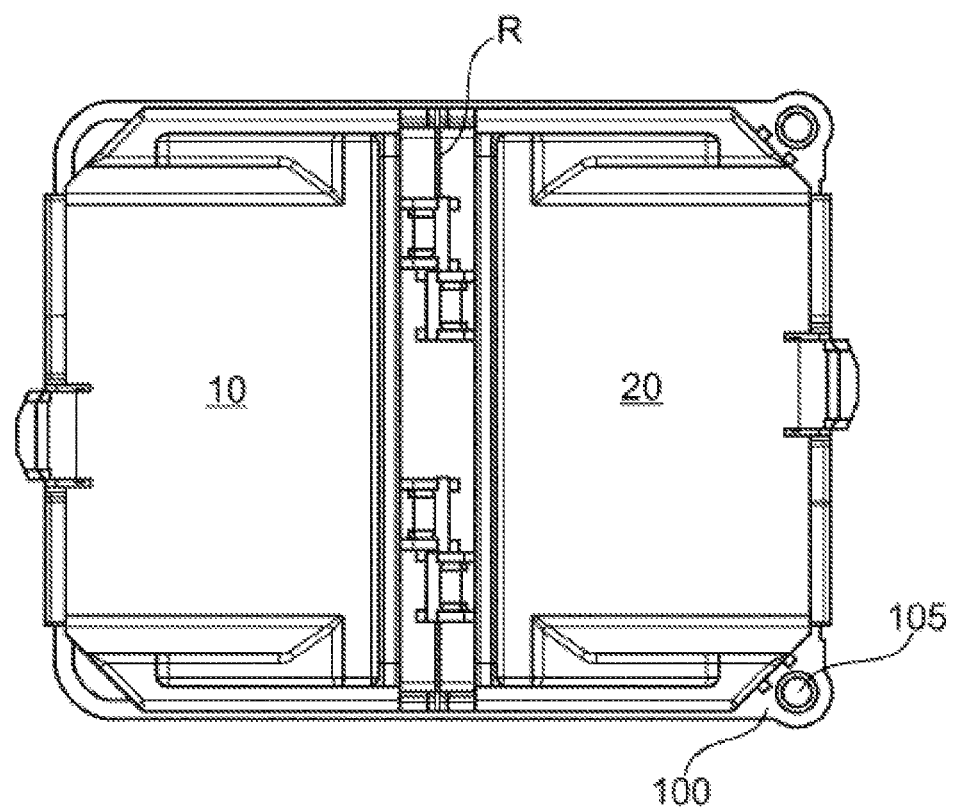
FIG. 4 shows a plan view of the casing with closed covering hoods.

Finally, FIG. 4 shows a plan view of the casing 100 with the covering hoods 10, 20 which are placed on it.

The special exemplary embodiment from FIG. 1 shows by way of example a casing 100 with a total of four gripping arms 111, 121, 112, 122. Two of the four gripping arms 111, 112 engage partially around the hinge elements 11, 12 of the first covering hood 10 (see FIG. 2 or 3). The two other gripping arms 121, 122 engage partially around the hinge elements 11, 12 of the second covering hood 20 which can be placed onto the casing 100 in a manner which is rotated by 180°. Moreover, the casing 100 comprises two bearings 141, 142 which are configured to support the hinge elements 11, 12 of the covering hoods 10, 20 in the direction of the casing 100 or of the connector region 110. The four gripping arms 111, 112, 121, 122 and the two bearings 141, 142 are arranged in such a way that the covering hoods 10, 20 which can be placed on the casing are mounted such that they can be rotated about a common rotational axis R.

The hinge elements 11, 12 define, for example, openings 31, 32 (see FIG. 2), into which in each case one of the at least two gripping arms 111, 112 of the casing 100 can be introduced, in order to engage partially around the hinge element 11, 12. In order to improve guidance and/or grip of the gripping arms 111, 112 in the openings 31, 32, the gripping arms 111, 112 can have deepened regions 161, 162 (see FIG. 1), into which correspondingly configured projections which extend from a main body 10a of the covering hoods 10, 20 into the openings 31, 32 can engage. As a result, moreover, the gripping arms 111, 112 can be formed in a reinforced manner laterally next to the deepened sections 161, 162, with the result that the risk of a fracture of the gripping arms 111, 112 is reduced.

The invention is not to be restricted to the four gripping arms which are shown, however. In the case of further exemplary embodiments, there can also be only two gripping arms (in each case one gripping arm for each covering hood). Said gripping arms can be of wider configuration, for example, or can be configured at a different position than the gripping arms of FIG. 1, for example at positions which are not symmetrical with respect to the center line M (see FIG. 2). For example, one gripping arm might extend at least partially over one half of the casing and the other gripping arm might extend over the other half.

The hinge element 11 in FIG. 2 (the same applies to the hinge element 12) comprises a rod-shaped section 11a which is held on a main body 10a of the covering hood 10 by way of two bridge sections 11b, 11c. The rod-shaped section 11a is shown in FIG. 2 at the top in the cross-sectional view along the line A, and comprises a flattened region 51 which is, for example, directed downward (that is to say, in the direction of the connector region 110 of the casing 100 after placing of the covering hood 10). This has the effect that the covering hood can be inserted into the bearing 141 in a perpendicular position. The flattened section 51 can also point in another direction; the covering hoods 10, 20 would then have to be placed at a different angle.

Moreover, the covering hood 10 comprises two projections 41, 42 which are arranged along an edge 10b of the covering hood 10 laterally offset next to the hinge elements 11, 12. The projections 41, 42 comprise, for example, a bearing section 71, as shown at the top left in the cross-sectional view along the line B in FIG. 2. Said projections 41, 42 serve as a bearing for the covering hood 20 which is arranged so as to lie opposite when the two covering hoods 10, 20 are placed onto the casing 100 from FIG. 1. The bearing section 71 is, for example, of partially round shape, in order to provide grip (or support) for the rod-shaped sections of the hinge element 11, 12 of the opposite covering hood 20.

In the exemplary embodiment which is shown, a plurality of electric (or else optical) connectors 210 are configured by way of example in the connector region 110 (see FIG. 1), which connectors 210 provide, for example, a socket for an electric connector cable (not shown). Moreover, casing cutouts 216 are configured in the casing 100, which casing cutouts 216 enclose the electric connector cable at least partially, in order to hold it fixedly on the casing 100 after the application of the covering hoods 10. To this end, the covering hood from FIG. 2 likewise comprises cutouts 16, to be precise at positions such that round openings result after the placing of the covering hood 10, 20, through which round openings the connector cables for the electric contact of the exemplary control unit can be guided.

Furthermore, the covering hood from FIG. 2 comprises an apron 15 which serves to protect the connector region 110 after the covering hood 10, 20 is placed onto the casing 100 (for example, against moisture or contamination).

The two covering hoods 10, 20 are placed on the connector region 110 of the casing 100 at different positions and can be closed rotationally. In order to close the covering hoods 10, the covering hoods 10, 20 comprise in each case one locking element 13 which can engage in each case into a closure element 130 of the casing 100, in order to close the covering hood 10, 20 on the casing 100 as a result. Unintentional opening of the covering hood 10 is prevented as a result.

The locking element 13 is, for example, a latching closure which is connected in a sprung manner to the main body 10a of the covering hood 10, with the result that it can be connected in a latching manner to the closure element 130 of the casing 100. The closure element 130 is configured, for example, as a latching element, and comprises a beveled section in a direction, in which the covering hood 10, 20 is placed, and a latching section, behind which the locking element 13 engages, in order to prevent opening of the covering hood 10, 20 after latching. In order to open the covering hood 10, 20, it is therefore necessary to turn or pull the sprung-mounted latching closure 13 away from the casing 100 and thus to open the latching connection. After the latching of the closure elements 130 into the corresponding locking element 13 of the covering hoods 10, 20, opening is blocked.

Figure 5:
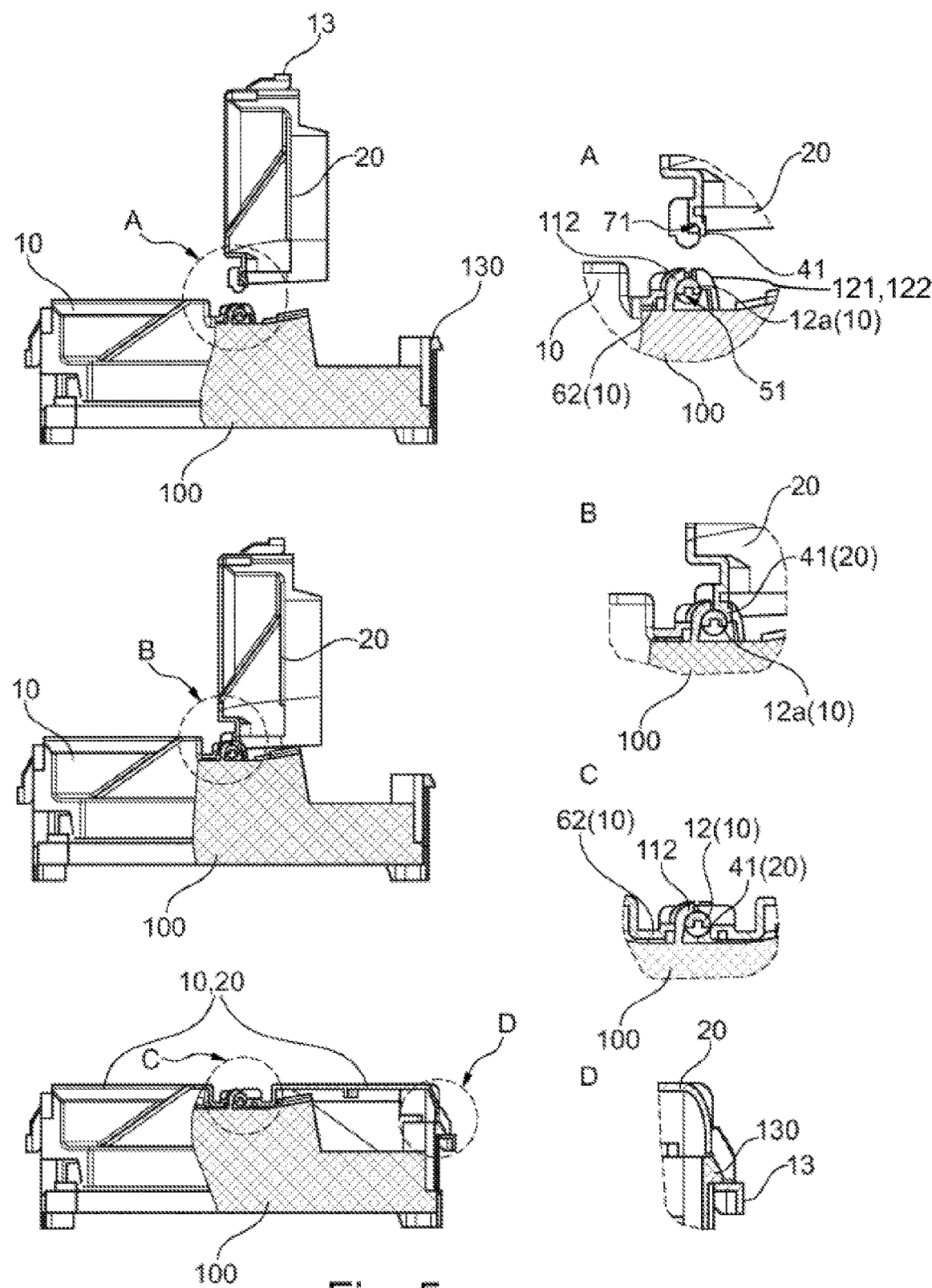
FIG. 5 illustrates the process of placing the covering hood onto the casing.

FIG. 5 illustrates the process of placing a covering hood 20 onto the casing 100, a covering hood 10 having already been placed on the casing 100 in the exemplary embodiment which is shown. The two covering hoods 10, 20 can be, for example, structurally identical.

In a starting stage (see top in FIG. 5), the covering hood 20 to be placed is moved into a perpendicular position relative to the casing 100. In said position (see the enlarged section A of the sectional illustration through the gripping arm 112), the hinge element 12 and the projection 62 of the placed covering hood 10 (see FIG. 2) are fixed by way of the gripping arm 112 of the casing 100. It can be seen at the same time in the enlarged section that the rod-shaped section 12a of the hinge element 12 has a flattened section 51. Said flattened section 51 is configured, for example, in such a way that, after the covering hood 10 is rotated into the right-angled position, the covering hood 10 can likewise be removed in the upward direction, since the flattened section 51 can be guided past the gripping arms 112 which engage only partially.

During the placing of the further covering hood 20, the projection 41 (see FIG. 2) abuts with the partially rounded bearing section 71 against the hinge element 12 of the covering hood 10. Therefore, the bearing section 71 provides a rotational bearing for the section 12a of rod-shaped design of the hinge element 12 (see FIG. 5, center). After the placing and the abutting of the bearing section 71 against the rod-shaped section 12a of the covering hood 10, the covering hood 20 can be rotated relative to the casing 100 until it passes into the closed state (see bottom left in FIG. 5). In the closed state, the projection 41 engages below the hinge element 12. At the same time, the hinge element 11 or 12 of the covering hood 20 (not visible in FIG. 5) engages below the gripping arms 122, 121 of the casing 100, to be precise in the same way as can be seen at the top of FIG. 5 for the covering hood 10. As a consequence, the covering hood 20 is also fixed firmly by way of the casing 100 and can no longer be moved away perpendicularly from the casing 100. After the latching of the locking element 13 into the closure element 130, a rotational movement of the covering hood 20 and therefore folding open of the covering hood 20 are also prevented. The covering hood 20 is then subsequently fixed on the casing 100.

The features of the invention which are disclosed in the description, the claims and the figures can be essential to the implementation of the invention both individually and in any desired combination.

THE LIST OF DESIGNATIONS IS AS FOLLOWS

10, 20 Covering hoods
11,12 Hinge elements
13 Locking element
15 Apron
16 Cutouts on the covering hood
41, 42 Projections
51 Flattened section
61, 62 Stops
71 (Rounded) bearing section
100 Casing
105 Fastening elements
110 Connector region
130 Closure element
161, 162 Deepened sections
210 Electric connectors
216 Casing cutouts
111,112,121,122 Gripping arms
141, 142 Bearings
R Common rotational axis

The invention claimed is:

1. A casing for a control unit, comprising:
   a connector region, situated on a connector side of the casing, is close-able by two covering hoods, each of the covering hoods including at least two hinge elements; and
   at least four gripping arms, one pair of which is configured to at least partially engage around the at least two hinge elements of one of the two covering hoods and to hold it rotationally along a rotational axis, and another pair of which is configured to at least partially engage around the at least two hinge elements of another one of the two covering hoods and to hold it rotationally along the rotational axis;
   wherein the two covering hoods are place-able at different positions on the connector region of the casing and are close-able rotationally, and
   wherein a side of the one of the two covering hoods having the at least two hinge elements is opposed to and adjacent to a corresponding side of the another one of the two covering hoods having the at least two hinge elements.

2. The casing of claim 1, wherein each of the covering hoods includes one locking element, including: two closure elements to engage around the locking elements of the two covering hoods and to block opening of the covering hoods.

3. The casing of claim 1, wherein the gripping arms and a closure element are configured to provide for swapping of the two covering hoods on the casing.

4. The casing of claim 1, wherein each of the covering hoods includes the two hinge elements which are arranged along an edge asymmetrically from a center of the edge, wherein two of the gripping arms hold one of the covering hoods and the other two gripping arms hold the other covering hood, and the two covering hoods are arranged rotated by 180° with respect to one another on the connector side of the casing.

5. The casing of claim 1, wherein the at least one hinge element includes a rod-shaped section which has a flattened section in a cross-sectional view perpendicularly with respect to a rotational axis of the hinge element, wherein at least two bearings which are configured to support the rod-shaped section of the hinge element toward the connector side of the casing and to mount it such that it is rotatable about the rotational axis, the gripping arms engaging only partially around the rod-shaped hinge elements of the two covering hoods, so as to provide for an insertion or a removal of the covering hood in at least one angular position relative to the casing, and to hold the covering hood on the casing by a positively locking connection after a rotation of the covering hood.

6. The casing of claim 1, wherein the gripping arms are configured to hold the two covering hoods so that they are rotatable about a common rotational axis.

7. A covering hood for a casing for a control unit, comprising:
   at least two hinge elements which are configured to be held rotationally by at least one pair of at least four gripping arms of the casing, wherein the casing is configured to receive two covering hoods;

wherein of the at least four gripping arms, one pair of is configured to at least partially engage around the at least two hinge elements of the covering hood and to hold it rotationally along a rotational axis, and another pair is configured to at least partially engage around the at least two hinge elements of another one of the two covering hoods and to hold it rotationally along the rotational axis;

wherein the covering hood is place-able at different positions on a connector region of the casing and is close-able rotationally, and wherein a side of the one of the two covering hoods having the at least two hinge elements is opposed to and adjacent to a corresponding side of the another one of the two covering hoods having the at least two hinge elements;

wherein the casing includes:
  a connector region, which is situated on a connector side of the casing, and which is close-able by the two covering hoods, each of the covering hoods including at least two hinge elements; and
  the at least four gripping arms, one pair of which is configured to at least partially engage around the at least two hinge elements of one of the two covering hoods and to hold it rotationally along a rotational axis, and another pair of which is configured to at least partially engage around the at least two hinge elements of another one of the two covering hoods and to hold it rotationally along the rotational axis.

8. The covering hood of claim 7, wherein each of the at least two hinge elements has a rod-shaped section which has a flattened section in a cross-sectional view perpendicularly with respect to a rotational axis of the hinge element, so as to provide for an insertion or removal of the covering hood in at least one angular position relative to the casing, and to hold the covering hood on the casing by a positively locking connection after a rotation of the covering hood.

9. The covering hood of claim 8, wherein each of the at least two hinge element defines an opening, into which one of the at least two gripping arms of the casing is introduce-able, so as to engage partially around the hinge element.

10. The covering hood of claim 7, wherein a closure element of the casing includes a latching element, which includes a locking element to prevent opening of the covering hood by coupling to the closure element of the casing, the locking element including a latching closure which is latchable on the latching element.

11. The covering hood of claim 7, wherein the casing includes at least one casing cutout, which includes at least one cutout which forms an opening with the casing cutout after closure of the covering hood, so as to introduce a connector line into the closed casing and to grip it; and/or a lateral apron for providing lateral protection for the connector line below the covering hood.

12. A control device for a vehicle or a commercial vehicle, comprising:
  a casing for a control unit, including;
  a connector region, situated on a connector side of the casing, is close-able by two covering hoods, each of the covering hoods including at least two hinge elements; and
  at least four gripping arms, one pair of which is configured to at least partially engage around the at least one hinge element of the two covering hoods and to hold it rotationally;

wherein the two covering hoods are place-able at different positions on the connector region of the casing and are close-able rotationally;

wherein each of the covering hoods includes: the at least two gripping arms of the one pair, which are configured to at least partially engage around at least one hinge element and to hold it rotationally; and the at least one hinge element which is configured to be held rotationally by at least one of the gripping arms, wherein the casing includes:
the connector region, which is situated on the connector side of the casing, and
which is close-able by the two covering hoods, each of the covering hoods including at least two hinge elements; and
the at least four gripping arms, one pair of which is configured to at least partially engage around the at least two hinge elements of one of the two covering hoods and to hold it rotationally along a rotational axis, and another pair of which is configured to at least partially engage around the at least two hinge elements of another one of the two covering hoods and to hold it rotationally along the rotational axis;

wherein a side of the one of the two covering hoods having the at least two hinge elements is opposed to and adjacent to a corresponding side of the another one of the two covering hoods having the at least two hinge elements.

13. A commercial vehicle, comprising:
a control unit, including a casing, including:
  a connector region, situated on a connector side of the casing, is close-able by two covering hoods, each of the covering hoods including at least two hinge elements; and
  at least four gripping arms, one pair of which is configured to at least partially engage around the at least two hinge elements of one of the two covering hoods and to hold it rotationally along a rotational axis, and another pair of which is configured to at least partially engage around the at least two hinge elements of another one of the two covering hoods and to hold it rotationally along the rotational axis;
  wherein the two covering hoods are place-able at different positions on the connector region of the casing and are close-able rotationally;
  wherein each of the covering hoods includes: the at least two gripping arms, which are configured to at least partially engage around at least one hinge element and to hold it rotationally; and the at least one hinge element which is configured to be held rotationally by at least one of the gripping arms, and
  wherein a side of the one of the two covering hoods having the at least two hinge elements is opposed to and adjacent to a corresponding side of the another one of the two covering hoods having the at least two hinge elements.

* * * * *